US006625074B2

(12) United States Patent
Forbes

(10) Patent No.: US 6,625,074 B2
(45) Date of Patent: Sep. 23, 2003

(54) SENSE AMPLIFIER WITH IMPROVED READ ACCESS

(75) Inventor: Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/304,491

(22) Filed: Nov. 26, 2002

(65) Prior Publication Data

US 2003/0076721 A1 Apr. 24, 2003

Related U.S. Application Data

(63) Continuation of application No. 09/912,622, filed on Jul. 24, 2001, and a continuation-in-part of application No. 09/651,632, filed on Aug. 30, 2000.

(51) Int. Cl.[7] .................................................. G11C 7/00
(52) U.S. Cl. ........................ 365/205; 365/203; 365/207
(58) Field of Search ................................. 365/205, 203, 365/207, 202, 189.01

(56) References Cited

U.S. PATENT DOCUMENTS 6,292,417 B1 * 9/2001 Seyyedy ..................... 365/203

* cited by examiner

Primary Examiner—David Lam
(74) Attorney, Agent, or Firm—Williams, Morgan & Amerson, P.C.

(57) ABSTRACT

A sensing circuit comprises a sense amplifier adapted to receive an input signal from a memory cell and to provide a first output signal on a first output node. An output amplifier is adapted to receive the first output signal and to provide a second output signal on a second output node. The output amplifier comprises an output amplifier pre-charge transistor coupled between a first power supply node and a second output node. The output amplifier pre-charge transistor is adapted to pre-charge the second output node to approximately the first power supply potential.

20 Claims, 7 Drawing Sheets

Fig. 5A
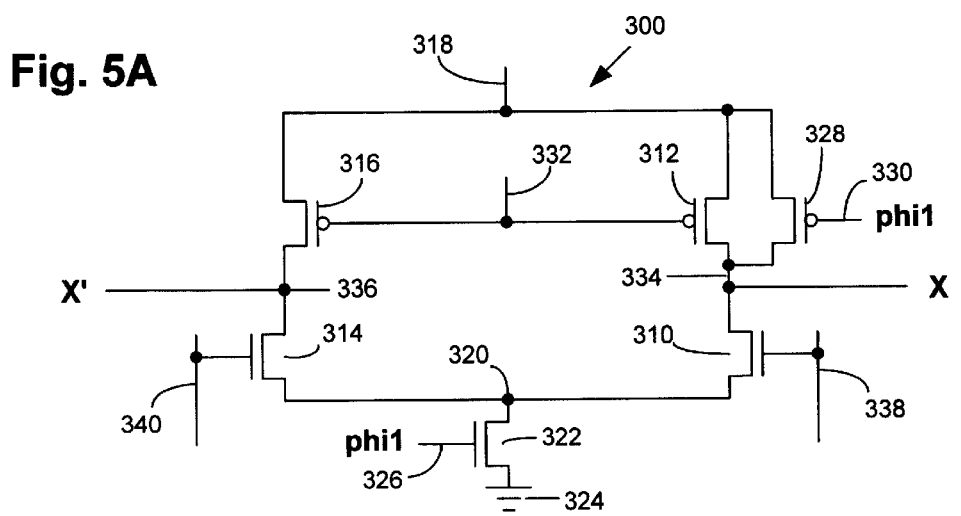
Fig. 5B
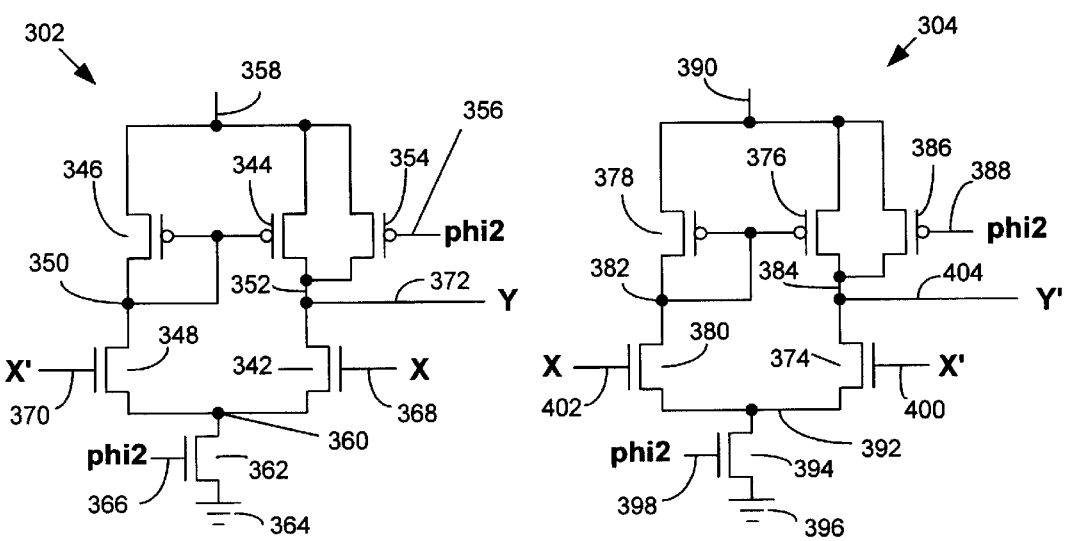
Fig. 5C
Fig. 5D
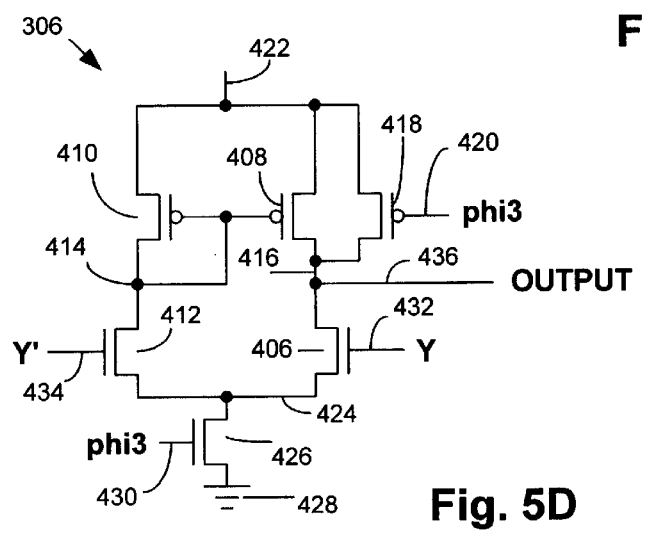

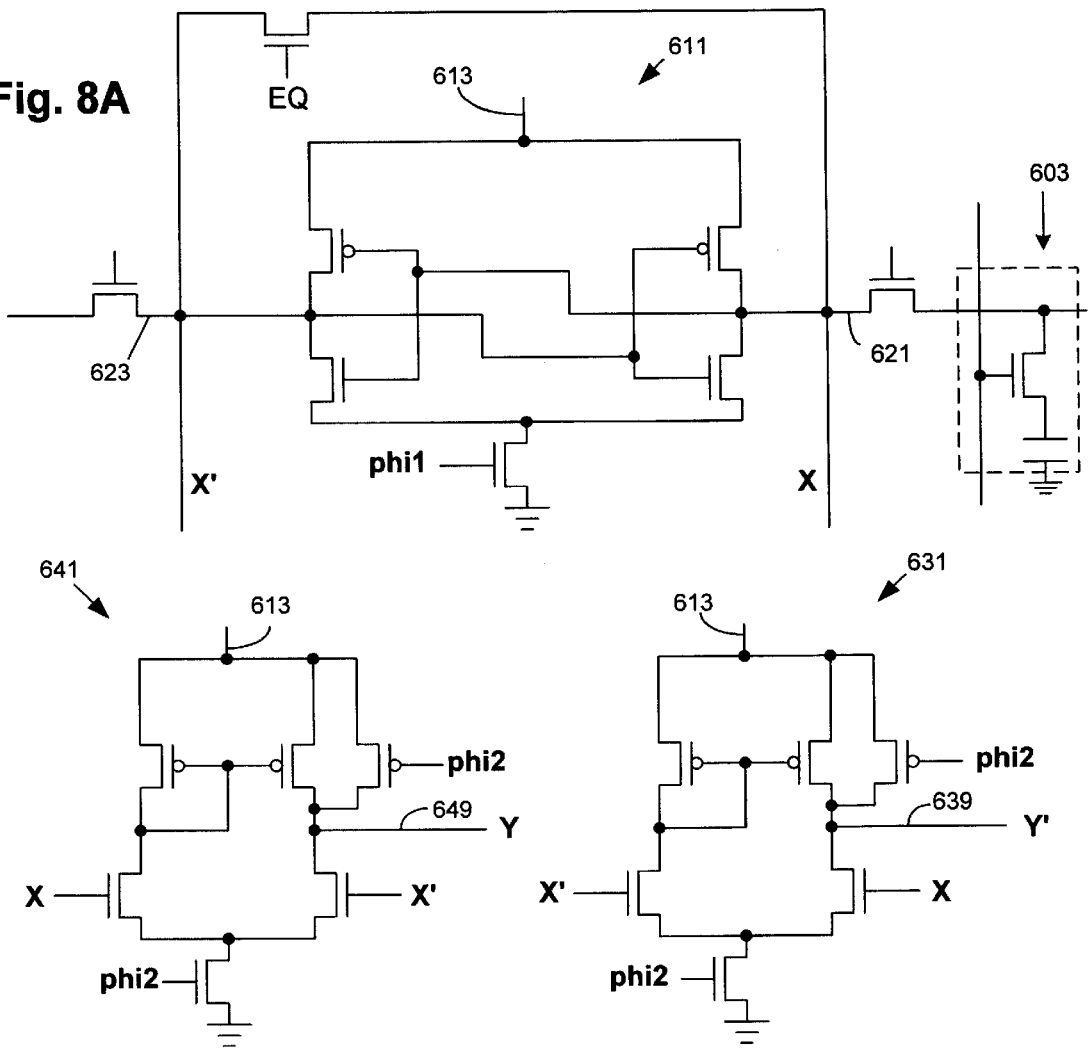
Fig. 8A
Fig. 8B
Fig. 8C
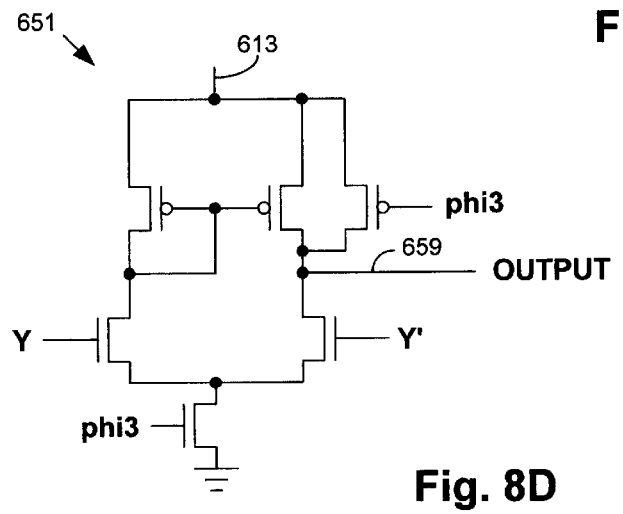
Fig. 8D

SENSE AMPLIFIER WITH IMPROVED READ ACCESS

CROSS-REFERENCE TO RELATED APPLICATION

This is a continuation of application Ser. No. 09/912,622 filed Jul. 24, 2001.

This present application is a continuation-in-part of application Ser. No. 09/651,632, filed Aug. 30, 2000, the entire contents of which is specifically incorporated herein by reference in its entirety.

BACKGROUND OF THE INVENTION

1. Field of the Invention

The present invention relates generally to semiconductor memory devices, and, more particularly, to sensing circuitry yielding an improved read access time.

2. Description of the Related Art

In many computer systems, high speed redundant memories are commonly used to store recently used data or data that will likely be needed very soon. These memories are referred to as cache memories. A cache memory mirrors data stored in the main memory of the computer system, but because of its significantly higher speed, the cache memory may supply data more quickly. Typically, dynamic random access memories (DRAMs) (synchronous or asynchronous) are used as main memory devices due to their relatively high densities. Cache memories are typically static random access memories (SRAMs). SRAMs generally have lower densities than DRAMs, but they are significantly faster. Because of their higher speeds of operation, SRAMs find additional application in various computer systems, and their use as cache memories is simply one example of their application. Other types of memories that are commonly found in computer systems include Flash, EAPROMs, EEPROMs, EPROMs, PROMs, ROMs, and variations of any of the above.

Various configurations of memory cells have been designed and developed to reduce the silicon area consumed by the cells, to increase the operating speed of the devices, and to achieve numerous other goals. Traditionally, for example, SRAM cells have been designed with either four transistors and two polysilicon load resistors, or six transistors, using two PMOS devices as active load devices. Reduction of silicon area consumed by an SRAM cell, i.e., increasing the density of cells in an SRAM device, can be realized by using cells with as few transistors as possible. In many stand-alone SRAM applications, polysilicon load resistors have replaced the PMOS load transistors in the six-transistor cells. Resistive load inverters, however, have very asymmetrical switching transients and have steady-state standby DC power dissipation. Accordingly, many SRAMs embedded in microprocessors have continued to use the six-transistor cells. Other SRAM designs have also been proposed. For example, U.S. Pat. No. 6,011,726, issued Jan. 4, 2000, entitled "Four Device SRAM Cell With Single Bit Line," describes a cell having four transistors and one polysilicon load resistor. Other approaches have used only four transistors and have relied upon the sub-threshold leakage of the transfer devices in place of load resistors or transistors. These types of cells have been referred to as "loadless" four-transistor CMOS SRAM cells with no polysilicon resistor.

Besides reducing silicon area consumed by a cell, other approaches have been explored in an effort to increase the efficiency of memories. Moreover, various approaches have been proposed to increase the speed with which memory cells may be accessed, for example, as when reading the contents of the cell. Single-ended sense amplifiers as well as a varied assortment of dual input sense amplifiers have been proposed and used. Regardless of the type of memory or the configuration of the memory cell, increasing the speed with which the cell may be accessed (i.e., decreasing access time) is, and will remain, a major concern.

By way of background and example only, FIG. 1 illustrates a conventional CMOS SRAM cell 10 in combination with a cross-coupled sense amplifier 20. The cell 10 could as well be a DRAM cell or some other memory cell type. The cell 10 is coupled to the sense amplifier 20 by way of a bit line 58 and a complementary bit line 60. The cell 10 includes two NMOS transistors 32, 34 and two resistors 36, 38. The transistor 32 and the resistor 36 are coupled in series between a power supply voltage 42 and a ground potential 44. The transistor 34 and the resistor 38 are also coupled in series between the power supply voltage 42 and the ground potential 44. The gate terminal of the transistor 32 is coupled to a node 48 between the transistor 34 and the resistor 38, and the gate terminal of the transistor 34 is coupled to a node 46 between the transistor 32 and the resistor 36. An access transistor 52 couples the node 46 of the cell 10 to the complementary bit line 60, and an access transistor 54 couples the node 48 of the cell 10 to the bit line 58. An access signal will be provided on line 56 when the cell 10 is to be coupled to the bit line 58 and the complementary bit line 60 so that a datum stored in the cell 10 may be read by way of the sense amplifier 20. The cell 10 is a symmetrical SRAM cell.

The sense amplifier 20 includes two NMOS transistors 62, 64 and two PMOS transistors 66, 68. The transistor 62 and the transistor 66 are coupled in series between a power supply voltage 42 and a ground potential 44, and the transistor 64 and the transistor 68 are coupled in series between the power supply voltage 42 and the ground potential 44. The gate of the transistor 62 is coupled to a node 72 between the transistors 64 and 68, while the gate of the transistor 64 is coupled to a node 70 between the transistors 62 and 66. The node 72 of the sense amplifier 20 is coupled to the bit line 58, while the node 70 of the sense amplifier 20 is coupled to the complementary bit line 60. When the datum in the cell 10 is to be read, the bit line 58 and the complementary bit line 60 are each pre-charged to a value of approximately one-half the full power supply voltage, or VDD/2. A datum is represented by one of two possible states in which the cell 10 may be maintained. For example, a logical "zero" may be represented in the cell 10 when the node 46 is at or near the ground potential and the node 48 is at or near the power supply potential. A logical "one" might be indicated by the node 48 being at or close to the ground potential and the node 46 being at or close to the power supply potential.

For purposes of explanation, assume the cell 10 stores a logical "one," meaning the node 48 is at or near the ground potential and the node 46 is at or near the power supply potential. Because the cell 10 is symmetrical, sensing a logical "one" or logical "zero" will require the same amount of time. After the bit line 58 and the complementary bit line 60 have been pre-charged to approximately one-half the power supply potential (by circuitry not shown), an access signal is provided on the line 56 to turn on the access transistors 52 and 54 to couple the nodes 46 and 48 to the complementary bit line 60 and the bit line 58, respectively. Because the node 48 is at a low potential, the transistor 32 is in an "off," or non-conducting, state, and because the node 46 is at a high potential, the transistor 34 is in its "on," or conducting, state. When the nodes 46 and 48 are coupled to the complementary bit line 60 and the bit line 58, respectively, the conducting transistor 34 will begin to pull the potential on tile bit line 58 toward the ground potential. Conversely, because the transistor 32 remains in a non-conducting, or essentially non-conducting, state, the potential on the complementary bit line 60 is pulled up toward the power supply potential through the resistor 36. As a differential voltage appears between the bit line 58 and the complementary bit line 60, the sense amplifier 20 will amplify the difference and drive the bit line 58 to ground potential and the complementary bit line 60 to the power supply potential. Output circuitry (not shown) will utilize the potential on the bit line 58 or the potential on the complementary bit line 60, or both, to produce an output signal indicative of the datum stored in the cell 10.

As further background and example, FIG. 2 illustrates a read operation on a conventional SRAM cell 100 using single-sided sensing when the bit lines are pre-charged to a high potential (rather than VDD/2). The cell 100 in FIG. 2 is identical to the cell 10 in FIG. 1. But, the cell 10 in FIG. 1 is coupled to a two-input sensing amplifier, whereas the sensing amplifier in FIG. 2 is single-sided. Depending on the state of the memory cell 100, either transistor 102 or transistor 104 will be conducting while the other is not conducting. When a transfer device (e.g., transistor 118) is activated to read the cell 100, the bit line is initially at a high potential, and if the transistor 104 in the cell is in a conducting state, it pulls the bit line toward ground potential. In the example of FIG. 2, the signal on the line 126 to the sense amplifier is in reality only single-sided, or single-ended. The signal is not differential and, as such, is more susceptible to common mode noise.

Static CMOS and static pseudo-NMOS logic circuits are widely used in CMOS technology in integrated circuits. Static CMOS has, for example, been widely used in the design of microprocessors. One problem related to static circuits is the asymmetrical switching characteristics, that is, the time required to pull down the output is generally much shorter than the time required to pull up the input. Thus, the normal stage propagation delay, tp, is then determined primarily by the slow pull up time. If a series of static CMOS logic circuits, in the simplest case inverters, are connected in a chain, then when the circuit is enabled or activated and the input changes state, every output must change state. This results in a long signal delay through the chain, is wasteful of energy, and causes high power dissipation.

The present invention is directed to sensing circuitry that provides decreased read access times while achieving greater stability and reliability in operation. The present invention relates to sensing circuitry where the output is predicted in advance of reading a memory cell. This prediction is reflected in pre-charging at output nodes in the circuitry. While, on average, this prediction may be wrong approximately one-half the time, the result in one exemplary embodiment is an overall reduction in access time of about 50%.

SUMMARY OF THE INVENTION

In one aspect of the present invention, a sense amplifier for an integrated circuit memory comprises first and second output nodes, and a pre-charged transistor coupled to the second output node and adapted to pre-charge the second output node to approximately a first power supply potential. The first output node is adapted to be pre-charged to a second power supply potential, and the sense amplifier is adapted to provide first and second output signals at the first and second output nodes, respectively, in response to at least a first input signal.

In another aspect of the present invention, a memory cell and sense amplifier combination in an integrated circuit comprises first and second output nodes, a first transistor coupled between a first power supply node and the first output node, a second transistor coupled between the first output node and a second power supply node, the second transistor having a gate terminal coupled to a first bit line, and a third transistor coupled between the first power supply node and the second output node. The combination further comprises a fourth transistor coupled between the first power supply node and the second output node, the fourth transistor having a gate terminal coupled to a clock signal line, the fourth transistor being adapted to pre-charge the second output node to approximately a potential at the first power supply node. A fifth transistor is coupled between the second output node and the second power supply node, and the fifth transistor has a gate terminal coupled to a second bit line. The first output node is adapted to be pre-charged to approximately a potential at the second power supply node, and the sense amplifier is adapted to provide first and second output signals at the first and second output nodes, respectively, in response to signals on the first and second bit lines and a clock signal on the clock signal line. A memory cell is adapted to be controllably coupled to the first bit line.

In yet another aspect of the present invention, a sensing circuit comprises a sense amplifier adapted to receive an input signal from a memory cell and to provide a first output signal on a first output node. An output amplifier is adapted to receive the first output signal and to provide a second output signal on a second output node. The sense amplifier comprises a sense amplifier pre-charge transistor coupled between a first power supply node and the first output node, and the sense amplifier pre-charge transistor is adapted to pre-charge the first output node to approximately a first power supply potential. The output amplifier comprises an output amplifier pre-charge transistor coupled between the first power supply node and the second output node, and the output amplifier pre-charge transistor is adapted to pre-charge the second output node to approximately the first power supply potential.

In yet another aspect of the present invention, a sensing circuit comprises a sense amplifier adapted to receive an input signal from a memory cell and a reference signal. The sense amplifier is adapted to produce a first output signal indicative of a difference between the input signal and the reference signal. An amplifier circuit is coupled to the sense amplifier and is adapted to receive the first output signal from the sense amplifier. The amplifier circuit is adapted to produce an amplifier output signal on an output line. The amplifier circuit comprises a pre-charge transistor coupled between a first power supply node and the output node, and the pre-charge transistor is adapted to pre-charge the output node to approximately a first power supply potential.

BRIEF DESCRIPTION OF THE DRAWINGS

The invention may be understood by reference to the following description, taken in conjunction with the accompanying drawings, in which like reference numerals identify like elements, and in which:

FIGS. 5A–5D are schematic diagrams of one illustrative embodiment of a sense amplifier and output circuitry embodying aspects of the present invention;

FIGS. 8A–8D is a schematic diagram illustrating a combination of a dynamic memory cell and a sense amplifier and output circuitry that embodies aspects of the present invention.

Figure 1:
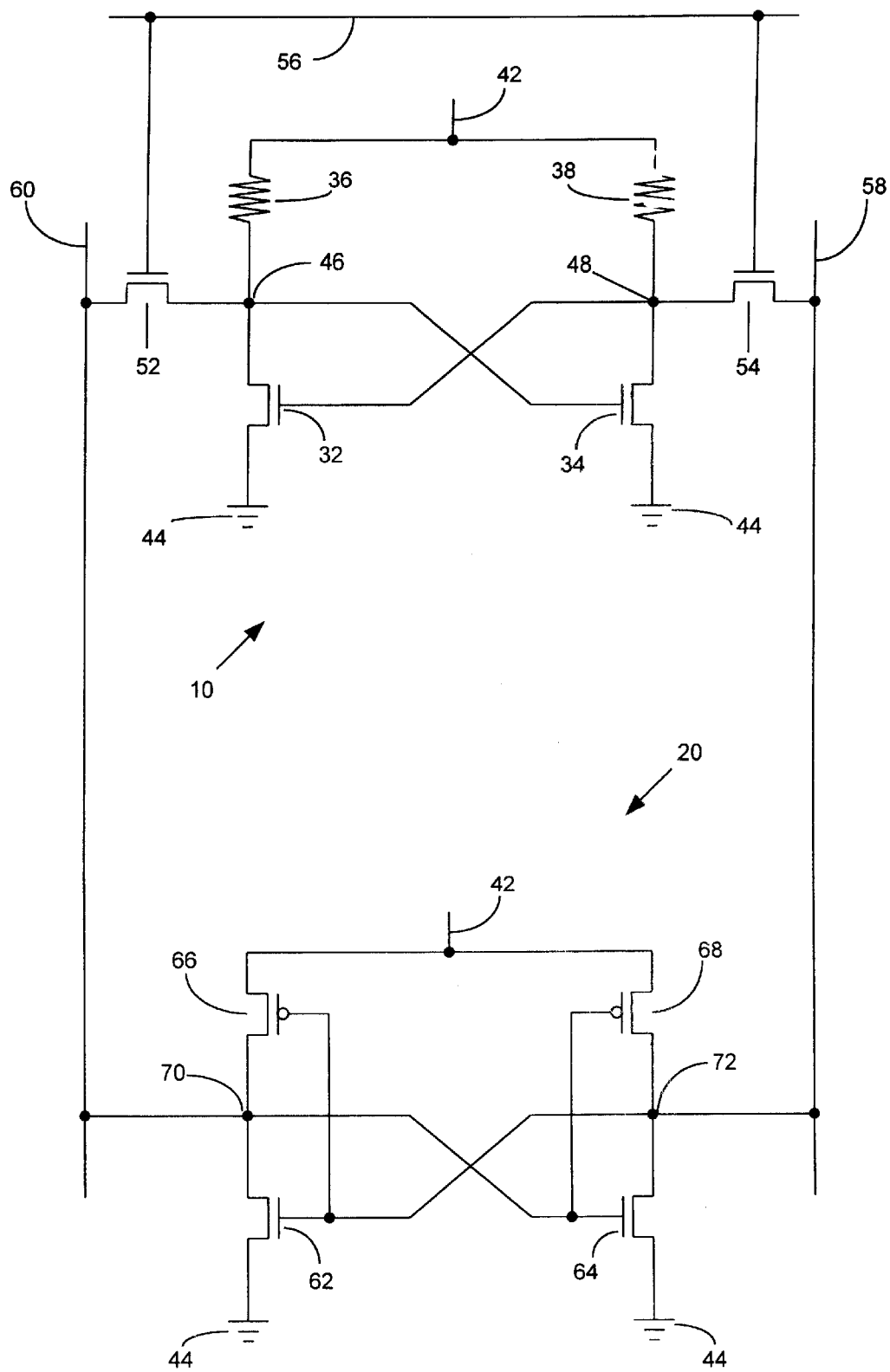
FIG. 1 illustrates a conventional CMOS SRAM cell in combination with a cross-coupled sense amplifier.
Figure 2:
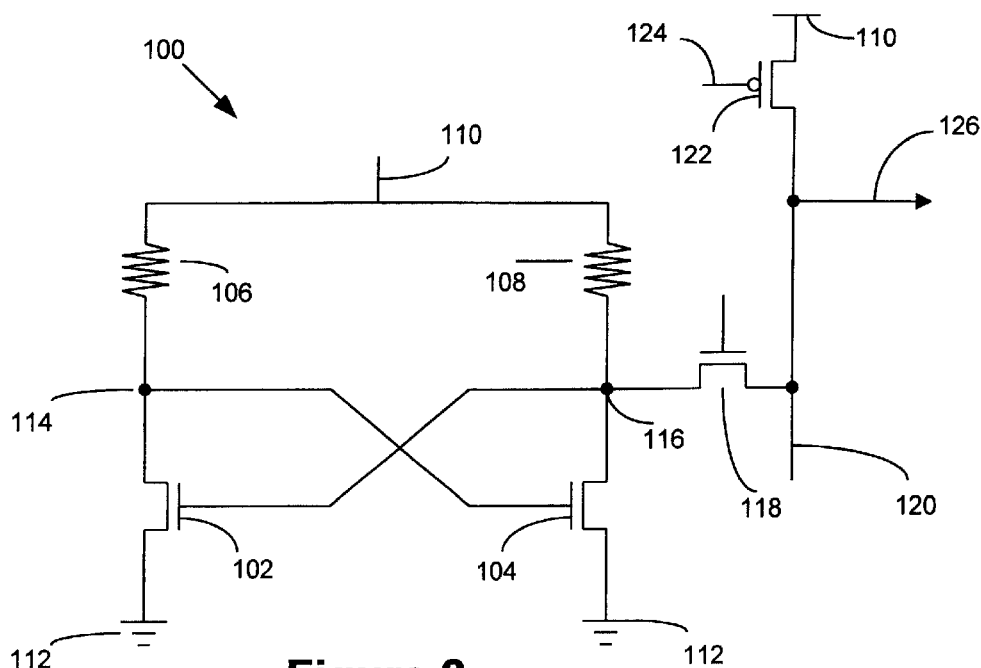
FIG. 2 illustrates a conventional SRAM cell as used in a single-sided sensing arrangement.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to FIGS. 3–4. In general, the present invention is directed to new sensing circuitry for improved access times in reading memory cells. The illustrative embodiment shown in FIGS. 3–4 and described herein utilizes n-channel and p-channel transistors in particular arrangements, as shown and as illustrated in combination with an SRAM memory cell. However, as will be readily apparent to those ordinarily skilled in the art upon a complete reading of the present application, the present invention is applicable to a variety of technologies, e.g., NMOS, PMOS, CMOS, SOI, etc., and the sensing circuitry of the present invention may be realized using a variety of transistors and devices in other forms and/or arrangements. Moreover, the sense circuitry that embodies the present invention may be utilized with any of a variety of memory cell types, e.g, DRAM, SRAM, Flash, EPROM, etc., memory cells. Further, the present invention will find application in a wide variety of integrated circuit devices, including, but not limited to, microprocessors, logic devices, memory devices, etc. Accordingly, the attached drawings and description herein are intended only to describe and explain illustrative examples of the present invention.

The illustrative embodiment of a memory cell described herein may be realized using various semiconductor manufacturing technologies. In particular, the memory cell may be realized using SOI technology. In SOI technology, PMOS devices and NMOS devices may be made with equal ease, as neither requires a separate substrate well, as in common in CMOS technology. Moreover, in SOI technology, as devices are scaled to deep submicron dimensions, the difference in performance between PMOS and NMOS devices becomes smaller since the saturation drift velocity for holes and electrons are not substantially different. Thus, while a preferred embodiment of a memory cell described herein is manufactured using SOI technology, a variety of other semiconductor manufacturing technologies may be used to gain all or many of the benefits of the present invention. Moreover, a variety of memory types (SRAM, DRAM, Flash, EPROM, etc.) may be used to advantage in combination with the exemplary sensing circuitry described below.

The illustrative SRAM cell described below allows faster read access times than conventional cells. As will be described more fully below, the improvement in read time performance arises, at least in part, by virtue of using one transistor (e.g., an NMOS transistor) to pull down one bit line in a memory array and another transistor (e.g., a PMOS transistor) to pull up another bit line in reading the datum stored in the cell. By using one transistor to pull down one bit line and another transistor to pull up another bit line, a faster differential signal is provided on the bit lines. In known configurations, where the bit lines are charged by resistive loads, the signal is slow by comparison. By combining the illustrative SRAM cell with a "predicted output" sensing arrangement, also described below, the access time in one state can be made essentially zero. The access delay in the other state can be made minimal, as the delay through three stages of sense amplification and output drivers may typically be the delay of only a single gate. The net result is a very fast read access.

Figure 3:
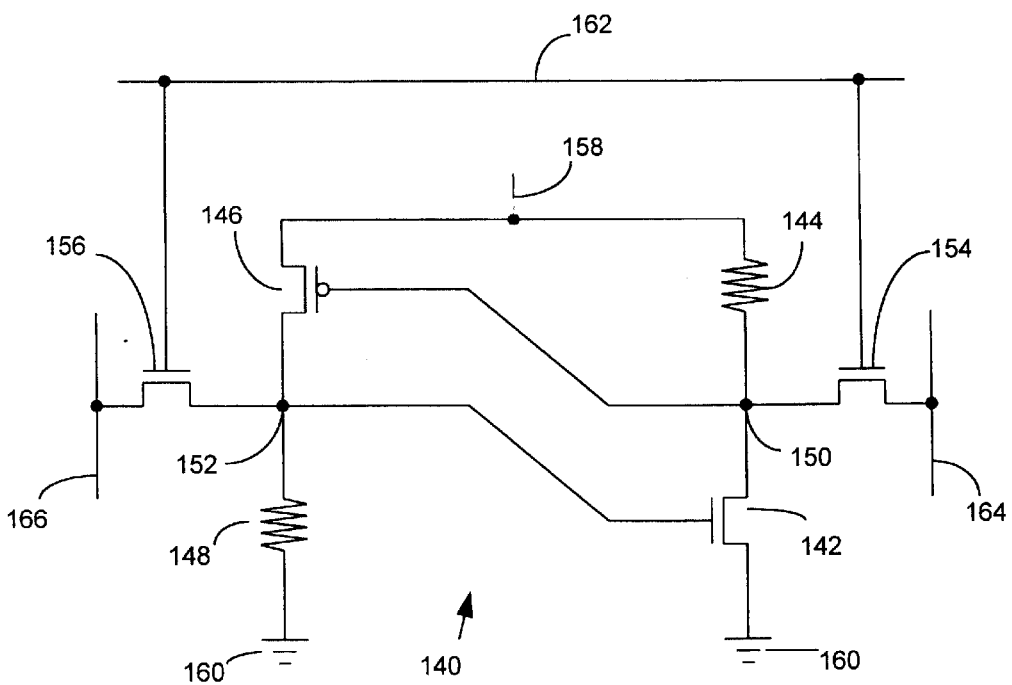
FIG. 3 is a schematic diagram of an illustrative SRAM cell that may utilize the sensing circuitry of the present invention.

FIG. 3 is a schematic diagram of one illustrative SRAM cell 140. The cell 140 includes one NMOS transistor 142 and one PMOS transistor 146, as well as two resistors 144, 148. Access transistors 154, 156 enable coupling of the cell 140 to a bit line 164 and a complementary bit line 166. The transistor 142 and the resistor 144 are coupled in series between a first power supply potential 158 and a second power supply potential 160. The transistor 146 and the resistor 148 are coupled in series between the power supply potential 158 and the second power supply potential 160. In the illustrative embodiment of FIG. 3, the first power supply potential 158 is a positive power supply potential 158, and the second power supply potential 160 is an electrical ground potential 160. Throughout the remainder of this description of the illustrative embodiments of the invention, it will be assumed that the first and second power supply potentials 158, 160 are realized as positive and ground potentials, respectively. In other embodiments, other power supply potentials may be substituted for the positive potential and ground potential.

A gate terminal of the transistor 142 is coupled to a node 152 between the transistor 146 and the resistor 148. A gate terminal of the transistor 146 is coupled to a node 150 between the transistor 142 and the resistor 144. When in its conducting state, the transistor 142 serves to maintain the voltage at the node 150 at or near the ground potential 160.

When in its conducting state, the transistor 146 serves to maintain the voltage at the node 152 at or near the power supply potential 158. When the transistor 142 is in its conducting state, the transistor 142 and the resistor 144 form a DC current path between the power supply potential 158 and the ground potential 160. When the transistor 146 is in its conducting state, the transistor 146 and the resistor 148 form a DC conductive path between the power supply potential 158 and the ground potential 160. When the transistors 142, 146 are in their non-conducting states, no DC current path will exist in the cell 140. When the cell 140 is in either of two stable states, the transistors 142, 146 will either both be conducting or both be non-conducting.

As a person of ordinary skill in the art will appreciate with the benefit of the present disclosure, the cell 140 is capable of storing a datum of information as represented by one of the two possible stable states of the cell 140. In one state, the node 152 will be at or near the ground potential 160 and the node 150 will be at or near the power supply potential 158. In this state, the transistors 142, 146 will both be in their non-conducting states. For purposes of explaining the operation of the cell 140 in FIG. 3, this state will be designated a logical "one." In a second state of the cell 140, the node 152 will be at or near the power supply potential 158, and the node 150 will be at or near the ground potential 160. In this state, the transistors 142, 146 will both be in their conducting states. For purposes of explaining the operation of the cell 140, this state of the cell 140 will be designated as a logical "zero."

Assume first that the cell 140 stores a logical "one" datum. The node 152 will be at or near the ground potential 160, and because the node 152 is coupled to the gate of the transistor 142, the transistor 142 will be in a non-conducting state. In that state, the transistor 142 cannot discharge any potential at the node 150 to the ground potential 160. Also, because the cell 140 is storing a logical "one," the node 150 will be at or near the power supply potential 158. Because the node 150 is coupled to the gate of the PMOS transistor 146, the transistor 146 will be in its non-conducting state as well. In this non-conducting state, the transistor 146 will be prevented from pulling the voltage at the node 152 toward the power supply potential 158. In this logical "one" state, no DC current path exists in the cell 140. With the cell 140 in this logical "one" state, if the cell 140 is to be "read," using the sense amplifier arrangement illustrated in FIG. 1, the bit line 164 and the complementary bit line 166 will each be pre-charged to a value of approximately one-half the power supply potential. An access signal will be provided on the line 162 to enable the access transistors 154 and 156 to couple the cell 140 to the bit line 164 and the complementary bit line 166, respectively. At that time, because the transistor 142 is non-conducting, or essentially non-conducting, the node 150, and thus the bit line 164, will be pulled toward the power supply potential 158 through the resistor 144. At the same time, because the transistor 146 is non-conducting, or essentially non-conducting, the potential at the node 152, and thus the potential on the complementary bit line 166, will be pulled toward the ground potential 160 through the resistor 148. In this manner, a differential voltage will appear between the bit line 164 and the complementary bit line 166. That differential will then be amplified by way of a sense amplifier, such as, for example, the sense amplifier 20 illustrated in FIG. 1.

Assume now that the cell 140 in FIG. 3 stores a logical "zero." In that state, the node 152 will be at or near the power supply potential 158, and the node 150 will be at or near the ground potential 160. The transistor 142 will be in its conducting state, maintaining the potential at the node 150 at or near the ground potential 160. The transistor 146 will also be in its conducting state, maintaining the voltage at the node 152 at or near the power supply potential 158. In this state, two parallel DC current paths will exist in the cell, the first through the transistor 142 and the resistor 144, and the second through the transistor 146 and the resistor 148. The resistors 144 and 148 may be sized so as to minimize the magnitude of DC current flowing through the cell, while at the same time not unduly restricting current flow, which will be needed when a logical "one" state is read from the cell as described above.

In certain configurations and under certain conditions, the cell 140 may be sensitive to leakage currents, noise and upset. If the NMOS transistor 142 is "off," then the node 150 may be sensitive to leakage current or noise, causing the potential on the node 150 to decrease and thereby allowing the PMOS transistor 146 to possibly turn "on." If the PMOS transistor 146 becomes active and the loop gain is larger than one, then the cell 140 can be "upset" or caused to switch states, resulting in a data error. Larger values of the resistor 144 make the cell 140 more sensitive to being upset. Likewise, if the PMOS transistor 146 is "off," the node 152 may be sensitive to noise and sub-threshold leakage, causing the voltage at the node 152 to increase, and thereby allowing the NMOS transistor 142 to possibly turn "on." If the NMOS transistor 142 turns "on" and if the loop gain becomes larger than one, the cell 140 can be upset. If the NMOS transistor 142 and the PMOS transistor 146 are "on" (e.g., if the cell 140 is storing a logical "zero"), they are in a low resistance state, and the cell 140 is insensitive to being upset.

Larger and larger values of the resistors 144, 148 make the cell 140 more sensitive to being upset. However, larger load resistors 144, 148 result in less power dissipation. Where the power supply potential 158 is 2.5 VDC, if the potential at the node 150 decreases below about 0.8 VDC, the gain will become larger than one and the cell 140 will be upset. Likewise, if the node 152 increases above about 0.2 VDC due to noise or sub-threshold leakage, the cell 140 can be upset. In one embodiment, selecting the resistors 144, 148 to be in the range of approximately 100 k ohms–200 k ohms adequately minimizes power dissipation while achieving satisfactory cell stability. Other resistor sizes may also be satisfactory, or indeed may be more desirable, in cells having various differing characteristics and/or configurations, or in circumstances involving different power supply voltages. A primary objective in sizing the resistors 144, 148 is the trade-off between cell stability and power dissipation and the optimization of that trade-off.

Continuing with FIG. 3, when the logical "zero" state of the cell 140 is to be read using, for example, the sense amplifier 20 illustrated in FIG. 1, the bit line 164 and the complementary bit line 166 will each be pre-charged to a potential of approximately one-half the power supply potential 158. At that time, an access signal will be provided on the line 162, enabling the access transistors 154 and 156 to couple the cell 140 to the bit line 164 and the complementary bit line 166, respectively. When the cell 140 has been thus coupled, the transistor 142, because it is in its conducting state, will begin to pull the voltage level on the bit line 164 toward the ground potential 160. At the same time, because the transistor 146 is also in its conducting state, the voltage on the complementary bit line 166 will be pulled toward the power supply potential 158. A potential difference will appear between the bit line 164 and the complementary bit line 166, and that differential will again be magnified by way of, for example, a sense amplifier such as the sense amplifier 20 illustrated in FIG. 1.

Figure 4:
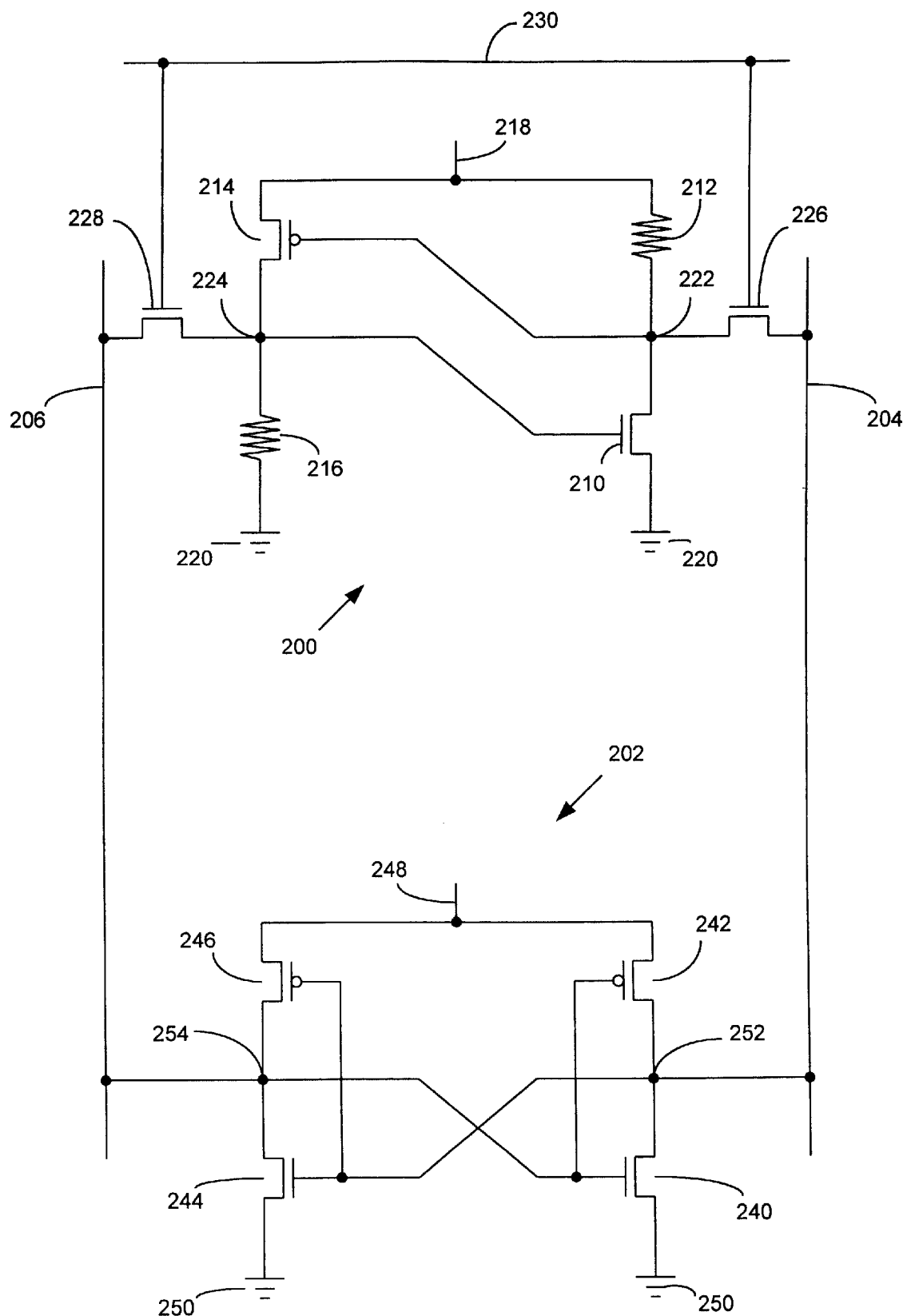
FIG. 4 is a schematic diagram of an illustrative SRAM cell combined with a conventional cross-coupled sense amplifier.

To further explain the operation of one illustrative example of the memory cell, FIG. 4 illustrates one particular SRAM cell 200 essentially identical to the SRAM cell 140 of FIG. 3 in combination with a sense amplifier 202. The cell 200 is coupled to the sense amplifier 202 by way of a bit line 204 and a complementary bit line 206. The cell 200 includes an NMOS transistor 210 coupled in series with a resistor 212 between a power supply potential 218 and a ground potential 220. The cell 200 also includes a PMOS transistor 214 coupled in series with a resistor 216 between the power supply potential 218 and the ground potential 220. A gate of the NMOS transistor 210 is coupled to a node 224 between the transistor 214 and the resistor 216, while a gate of the PMOS transistor 214 is coupled to a node 222 between the transistor 210 and the resistor 212. The node 222 may be coupled to the bit line 204 by way of an access transistor 226 when an access enable signal is provided at the line 230. The node 224 may be coupled to the complementary bit line 206 by way of an access transistor 228 when the access enable signal is provided at the line 230. The storing of a logical "zero" or logical "one" datum in the cell 200 was explained above in conjunction with the cell 140 in FIG. 3.

The sense amplifier 202 in FIG. 4 includes an NMOS transistor 240 and a PMOS transistor 242 coupled in series between a power supply potential 248 and a ground potential 250. The sense amplifier 202 also includes an NMOS transistor 244 and a PMOS transistor 246 coupled in series between the power supply potential 248 and the ground potential 250. A gate of the NMOS transistor 240 is coupled to a gate of the PMOS transistor 242, and the gates of the transistors 240 and 242 are coupled to a node 254 between the transistor 244 and the transistor 246. A gate of the NMOS transistor 244 is coupled to a gate of the PMOS transistor 246, and the gates of the transistors 244 and 246 are coupled to a node 252 between the transistor 240 and the transistor 242.

In reading a datum from the cell 200, the bit line 204 and complementary bit line 206 may each be pre-charged to a value of VDD/2, or approximately one-half the power supply potential. Thereafter, the sense amplifier 202 may magnify a potential difference induced on the bit line 204 and complementary bit line 206 by the action of the cell 200. Because the cell 200 is asymmetrical, the response time for the sensing operation depends on which of the two stable states exists in the cell 200. When the transistors 210, 214 are non-conducting, the resistor 212 will attempt to pull the bit line 204 up while the resistor 216 will attempt to pull the complementary bit line down. This situation (as compared to the transistors 210, 214 in their conducting states) provides the slower read response. For example, when the resistors 210, 214 are each about 100 k ohms, and when the cell 200 is used in conjunction with the conventional sense amplifier 202 of FIG. 4, approximately 2.0 nanoseconds is required for a 0.25 volt change in the output of the sense amplifier 202.

FIGS. 5A–5D are schematic diagrams of one illustrative sense amplifier and output circuitry embodying aspects of the present invention. The configuration and operation of the particular sense amplifier and output circuitry of FIGS. 5A–5D provides significantly shorter read access times than provided by conventional devices. In one embodiment, the cell 140 of FIG. 3 may be combined with the sense amplifier 300 and output circuitry 302, 304, 306 of FIGS. 5A–5D to provide read access times as much as three times faster than combinations of conventional cells and circuitry.

Referring to FIGS. 5A–5D, the sense amplifier 300 is coupled to a bit line 338 and a complementary bit line 340 and provides outputs X and X'. The signals X and X' are both coupled to each of the driver amplifiers 302 and 304. The signal X is coupled to a gate of the transistor 342 in the driver amplifier 302 and to a gate of the transistor 380 in the driver amplifier 304. The signal X' is coupled to a gate of the transistor 348 in the driver amplifier 302 and to a gate of the transistor 374 in the driver amplifier 304. The driver amplifiers 302 and 304 produce signals Y and Y', respectively. The signals Y and Y' are coupled as input signals to the output driver 306.

The sense amplifier 300 includes an NMOS transistor 314 coupled in series with a PMOS transistor 316 between a power supply potential 318 and a node 320 in the sense amplifier 300. An NMOS transistor 310 is coupled in series with a PMOS transistor 312 between the power supply potential 318 and the node 320. A PMOS transistor 328 is coupled in parallel to the PMOS transistor 312, that is, the PMOS transistor 328 is coupled between the power supply potential 318 and a node 334 between the transistors 310 and 312. The gates of the PMOS transistors 316 and 312 are coupled together, and together are coupled to a ground potential 332. Thus, the PMOS transistors 312 and 316 are maintained in their conducting states. The PMOS transistor 328 is biased at its gate by a clock signal phi1 on the line 330, as will be more fully explained below. The PMOS transistor 328 will provide a pre-charge function, enabling the pre-charge of the node 334 to a high potential. The node 320 in the sense amplifier 300 is coupled to a ground potential 324 through an NMOS transistor 322 that is biased at its gate by the clock signal phi1 on the line 326. A bit line 338 is coupled to the gate of the NMOS transistor 310, while a complementary bit line 340 is coupled to the gate terminal of the NMOS transistor 314. Through an operation of the sense amplifier 300, the signal X will be provided at the node 334, and the signal X' will be provided at the node 336.

The driver amplifier 302 includes an NMOS transistor 348 coupled in series with a PMOS transistor 346 between a power supply potential 358 and a node 360. An NMOS transistor 342 is coupled in series with a PMOS transistor 344 between the power supply potential 358 and the node 360. A PMOS transistor 354 is coupled in parallel with the PMOS transistor 344, that is, the PMOS transistor 354 is coupled between the power supply potential 358 and a node 352 between the transistors 342 and 344. The gate terminals of the PMOS transistors 344 and 346 are coupled together, and together they are coupled to a node 350 between the transistors 346 and 348. The gate of the PMOS transistor 354 is biased by a clock signal phi2 on the line 356. The node 360 is coupled to a ground potential 364 through an NMOS transistor 362 which is biased at its gate by the clock signal phi2 on the line 366. The gate of the transistor 342 is coupled at line 368 to receive the signal X from the sense amplifier 300. The gate of the transistor 348 is coupled at line 370 to receive the signal X' from the sense amplifier 300. The driver amplifier 302 provides an output signal Y at the node 352 on line 372. The clock signal phi2 lags the clock signal phi1 by an amount of time sufficient for the sense amplifier 300 to provide valid signals X and X' to the driver amplifier 302.

The driver amplifier 304 includes an NMOS transistor 380 coupled in series with a PMOS transistor 378 between a power supply potential 390 and a node 392. An NMOS transistor 374 is coupled in series with a PMOS transistor 376 between the power supply potential 390 and the node 392. A PMOS transistor 386 is coupled in parallel with the PMOS transistor 376, that is, the PMOS transistor 386 is coupled between the power supply potential 390 and a node 384 between the transistors 374 and 376. The gate terminals of the PMOS transistors 376 and 378 are coupled together, and together they are coupled to a node 382 between the transistors 378 and 380. The gate of the PMOS transistor 386 is biased by the clock signal phi2 on the line 388. The node 392 is coupled to a ground potential 396 through an NMOS transistor 394 which is biased at its gate by the clock signal phi2 on the line 398. The gate of the transistor 374 is coupled at line 400 to receive the signal X' from the sense amplifier 300. The gate of the transistor 380 is coupled at line 402 to receive the signal X from the sense amplifier 300. The driver amplifier 304 provides an output a signal Y' at the node 384 on line 404.

The output driver 306 includes an NMOS transistor 412 coupled in series with a PMOS transistor 410 between a power supply potential 422 and a node 424. An NMOS transistor 406 is coupled in series with a PMOS transistor 408 between the power supply potential 422 and the node 424. A PMOS transistor 418 is coupled in parallel with the PMOS transistor 408, that is, the PMOS transistor 418 is coupled between the power supply potential 422 and a node 416 between the transistors 406 and 408. The gate terminals of the PMOS transistors 408 and 410 are coupled together, and together they are coupled to a node 414 between the transistors 410 and 412. The gate of the PMOS transistor 418 is biased by a clock signal phi3 on the line 420. The node 424 is coupled to a ground potential 428 through an NMOS transistor 426 which is biased at its gate by the clock signal phi3 on the line 430. The gate of the transistor 406 is coupled at line 432 to receive the signal Y from the driver amplifier 302. The gate of the transistor 412 is coupled at line 434 to receive the signal Y' from the driver amplifier 304. The output driver 306 provides an output signal OUTPUT at the node 416 on line 436. The clock signal phi3 lags the clock signal phi2 by an amount of time sufficient for the driver amplifiers 302, 304 to provide valid signals Y and Y' to the output driver 306.

Figure 6:
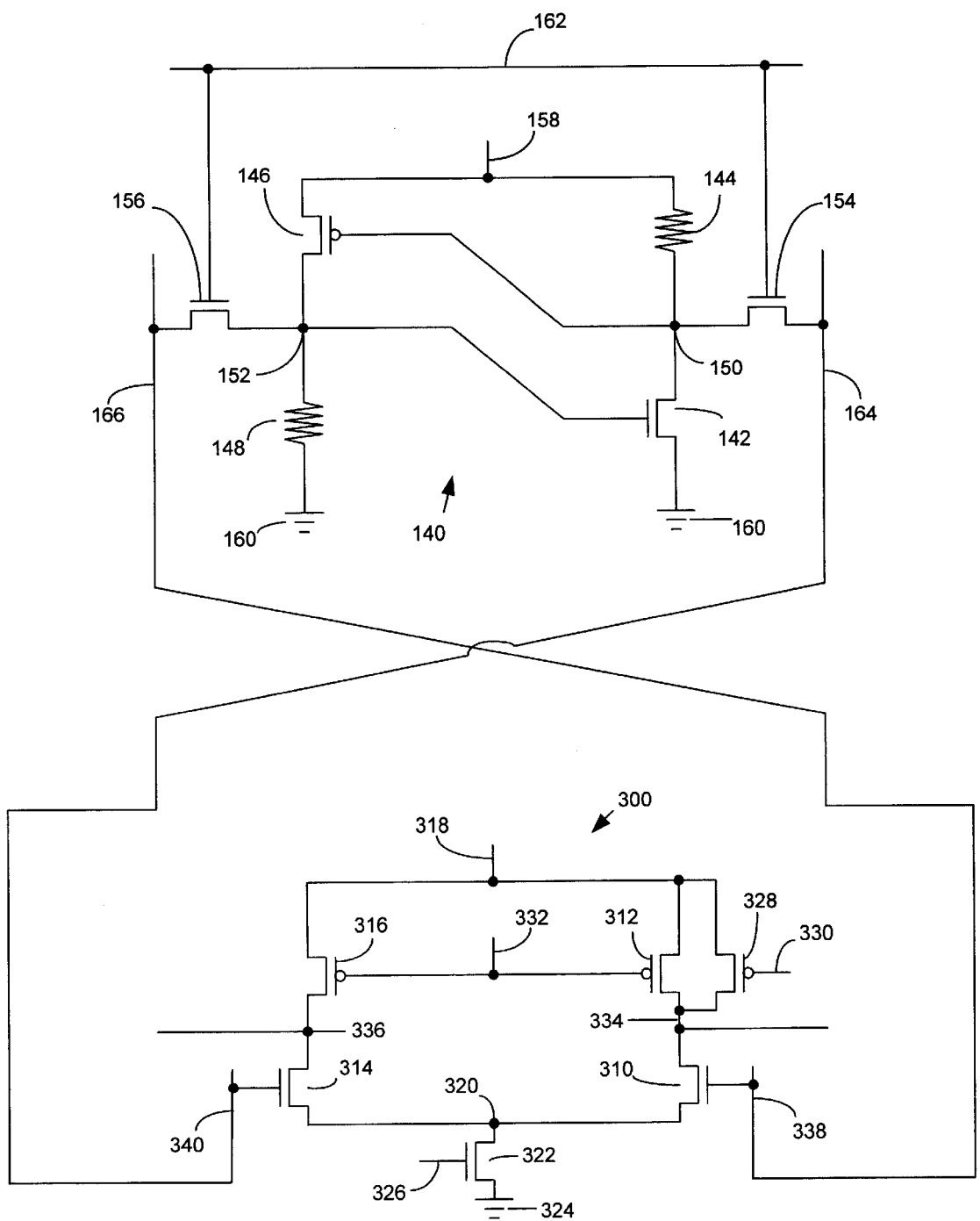
FIG. 6 is a schematic diagram illustrating a combination of the SRAM cell 140 of FIG. 3 and the sense amplifier 300 of FIG. 5A.

FIG. 6 is a schematic diagram illustrating a combination of the SRAM cell 140 of FIG. 3 and the sense amplifier 300 of FIG. 5A. In this combination, the bit line 164 of FIG. 3 corresponds to the bit line 340 of Figure 5A, and the complementary bit line 166 of FIG. 3 corresponds to the complementary bit line 338 of FIG. 5A. As already mentioned, the SRAM cell 140 is asymmetrical, and the read response time for the cell 140 is slower when the cell 140 stores a logical "one" datum than when the cell 140 stores a logical "zero" datum. The logical "one" state of the cell 140 represents that state in which both of the transistors 142, 146 are non-conducting. The node 150 is at a high potential, and the node 152 is at a low potential. The logical "zero" state of the cell 140 represents that state in which both of the transistors 142, 146 are conducting. The node 150 is at a low potential, and the node 152 is at a high potential. When the cell 140 is to be coupled to the sense amplifier 300 for sensing the state of the cell 140, the bit line 164 will be pre-charged to a high potential, and the complementary bit line 166 will be pre-charged to a low potential (essentially ground potential). In other words, the bit line 164 and the complementary bit line 166 are pre-charged to a state that would be the result obtained in the event a logical "one" is stored in the cell 140. That is, the output will be predicted to be a logical "one." When the cell 140 is coupled to the pre-charged bit line 164 and complementary bit line 166, if a logical "one" is stored in the cell 140, no charging of the bit line 164 through the resistor 144 or discharging of the complementary bit line 166 through the resistor 148 will be necessary. If a logical "zero" is stored in the cell 140, the bit line 164 will be discharged through the transistor 142, and the complementary bit line 166 will be charged through the transistor 146.

The time required to discharge and charge, respectively, the capacitive loads of the bit line 164 and complementary bit line 166 through the transistors 142, 146 is much less than the time required to charge and discharge, respectively, the bit line 164 and the complementary bit line 166 through the resistors 144 and 148. Moreover, switching transients on resistive load inverters are wildly asymmetrical. The transient where the active transistor is discharging the capacitive load is almost an order of magnitude shorter in time than the transient where the load resistor charges the capacitive load. As a result of the fully differential signal and faster charging transients when the transistors 142 and 146 are both conducting in the SRAM cell 140, the output of the sense amplifier 300 takes only about 1.0 nanoseconds to change by 0.25 volts. This is about three times faster than that for the conventional SRAM cell read sense operation. Thus, combining the SRAM cell 140 with the "predicted output" sense amplifier 300 with clocked sense amplifiers results in very fast read access times.

In a typical collection of memory cells, on average, only one-half the cells will store a logical "zero." Thus, in a collection of SRAM cells such as the cell 140, on average, only one-half the cells will conduct DC current. On average, one-half the time, the transistors 142, 146 will both be non-conducting and the resistive loads 144, 148 will maintain one output high and the other output low. The resistive loads 144, 148 serve only to maintain one of the output nodes 150 of the cell 140 high and the other output node 152 of the cell 140 low when both of the transistors 142, 146 are non-conducting. When the access transistors 154, 156 couple the cell 140 to the lines 164, 166 when both transistors 142, 146 are non-conducting, there will be no change in the state of the lines 164, 166. Thus, the resistors 144, 148 play no role in charging or discharging the lines 164, 166 during sensing. On the other hand, the transistors 142, 146 can quickly discharge and charge, respectively, the lines 164, 166.

In the sense amplifier 300, as well as in the driver amplifiers 302, 304 and output driver 306 (see FIGS. 5A–5D), the slowest transition is from low to high, where the PMOS transistor 312, 344, 376 or 408 charges up the output node 334, 352, 384 or 416, respectively. Accordingly, the output nodes are all preferably pre-charged high, and the only transition possible in the sense amplifier 300, driver amplifiers 302, 304 or output driver 306 is the faster high-to-low transition. If a "one" is stored in the cell 140, then during sensing and during clocking of the amplifiers, only the output node 352 of the driver amplifier 302 (see FIG. 5B) must change state, from high to low. Also, because of the gain of the amplifiers, the output node 352 of the driver amplifier 302 need not be pulled completely low before its output signal is valid. The output signal will be valid shortly after the clock signal phi2 goes high and essentially valid when the clock signal phi3 goes high. If a "zero" is stored in the cell 140, then during sensing and clocking, the output nodes 334 and 404 of the amplifiers 300 and 304 and the output node 416 of the amplifier 306 go low. Under this sense amplifier and output circuitry arrangement, all changes in state are from high to low. No low-to-high transitions, which are the slower transitions, are required in the chain of amplifiers. Therefore, in the chain of amplifiers, the clocks can be separated by only a fraction of the propagation delay of a single stage. In other words, the output data in this case will be valid after the propagation delay of a single stage.

Figure 7:
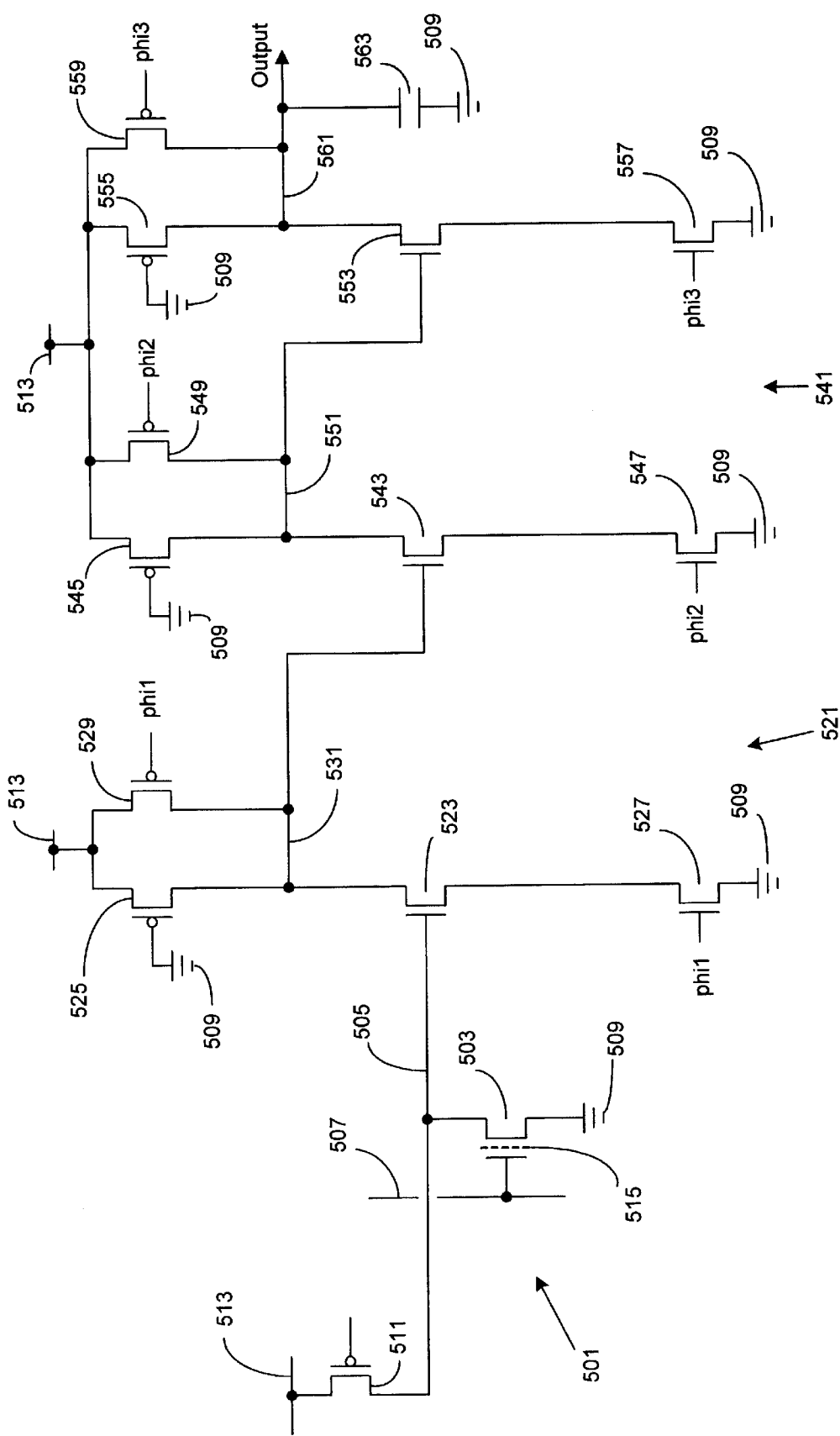
FIG. 7 is a schematic diagram illustrating a combination of a static memory cell and a sense amplifier and output circuitry that embodies aspects of the present invention.

FIG. 7 illustrates a combination of a static memory cell and a sense amplifier and output circuitry that embodies aspects of the present invention. In the illustration of FIG. 7, the static memory cell 503 is a Flash memory cell. Alternatively, the static memory cell 503 may be an EAPROM, EEPROM, PROM, ROM or SRAM cell. The static memory cell 503 has an output or drain coupled to a data bit line 505. The memory cell 503 has a source coupled to an electrical potential 509, in this case an electrical ground potential. The static memory cell 503 has a gate that is coupled to an address word line 507. The embodiment illustrated in FIG. 7 also includes a pre-charge transistor 511 coupled between the data bit line 505 and an electrical potential 513, in this case a high electrical potential. As will be understood by those of ordinary skill in the art, the pre-charge transistor 511 will pre-charge the data bit line 505 to the value of the potential 513 when the gate of the pre-charge transistor 511 is at a low potential, as the pre-charge transistor 511 is, in this illustration, a PMOS transistor. An appropriate timing signal may be used to control the pre-charge transistor 511 to appropriately pre-charge the data bit line 505.

During operation of the device of FIG. 7, if the floating gate 515 of the static memory cell 503 is not charged, when the address word line 507 is raised to a high potential, the output or drain of the static memory cell 503 will pull down any potential on the data bit line 505. If, on the other hand, the floating gate 515 in the static memory cell 503 is charged, the memory cell 503 will not discharge a potential on the data bit line 505 when the address word line 507 is activated. The charged and uncharged states of the floating gate 515 in the static memory cell 503 may be used to represent logic "0" and "1" states. The state of the memory cell 503 may be detected by the sense amplifier 521 by detecting the potential on the data bit line 505 after the address word line 507 has been activated.

The sense amplifier 521 includes an input transistor 523 whose gate is coupled to the data bit line 505. If the electrical potential on the data bit line 505 is relatively high, the input transistor 523 will be enabled to conduct, whereas if the electrical potential on the data bit line 505 is relatively low, the input transistor 523 will not be enabled to conduct (or, alternatively, will be enabled to conduct very little). Between the input transistor 523 and the electrical potential 509 is a transistor 527 whose gate is coupled to receive a clock signal phi1. When the clock signal phi1 is relatively high, the transistor 527 will couple the input transistor 523 to the electrical potential 509. The input transistor 523 has a drain or output coupled to a node 531. Coupled between the node 531 and an electrical potential 513 are two PMOS transistors 525, 529. The PMOS transistor 525 has its gate coupled to an electrical ground potential 509. The PMOS transistor 529 has its gate coupled to receive the clock signal phi1. When the clock signal phi1 is relatively high, the PMOS transistor 529 will be in a non-conducting state, whereas when the clock signal phi1 is in a relatively low value, the PMOS transistor 529 will be in a conducting state. During this conducting state, the node 531 will be charged to at least approximately the potential of the electrical potential 513.

The embodiment illustrated in FIG. 7 further includes an output amplifier and driver circuitry 541. The output amplifier and driver circuitry 541 in the illustrated embodiment is realized in pseudo-NMOS technology. The node 531 of the sense amplifier 521 is coupled to the gate of an input transistor 543. Coupled between the source of the input transistor 543 and the electrical ground potential 509 is a transistor 547 whose gate is coupled to receive a clock signal phi2. The output or drain of the input transistor 543 is coupled to a node 551, and between the node 551 and the electrical potential 513 are two transistors in parallel, PMOS transistor 545 and PMOS transistor 549. PMOS transistor 545 has its gate coupled to an electrical ground potential 509, and the PMOS transistor 549 has its gate coupled to receive the clock signal phi2. When the clock signal phi2 is at a relatively low value, the PMOS transistor 549 will conduct to pre-charge the node 551 to at least approximately the electrical potential 513. During this period, the transistor 547 will be relatively non-conducting. When the clock signal phi2 assumes a relatively high value, the PMOS transistor 549 will be turned off, while the transistor 547 will be turned on, effectively coupling the source of the input transistor 543 to the electrical ground potential 509.

The node 551 is coupled to the gate of an input transistor 553. A transistor 557 is coupled between the source of the input transistor 553 and the electrical ground potential 509. The gate of the transistor 557 is coupled to receive a clock signal phi3. The input transistor 553 has its output or drain coupled to a node 561, which, in the illustrated embodiment, carries the output signal from the output amplifier and driver circuitry 541. Between the node 561 and the electrical potential 513 are two PMOS transistors in parallel, transistor 555 and transistor 559. The transistor 555 has its gate coupled to an electrical ground potential 509, whereas the PMOS transistor 559 has its gate coupled to receive the clock signal phi3. When the clock signal phi3 is in its relatively low value, the PMOS transistor 559 will pre-charge the node 561 to at least approximately the value of the electrical potential 513. A capacitor 563 is coupled between the output node 561 and the electrical ground potential 509. When the node 561 is pre-charged to approximately the value of the electrical potential 513, the capacitor 563 will assist in maintaining that potential at the node 561.

In the operation of the circuitry shown in FIG. 7, data is read off the data bit line 505 by the sense amplifier 521, and is further amplified and the signal strengthened by the output amplifier and driver circuitry 541. The sense amplifier 521 is pre-charged and enabled by the transistors 527, 529 and the clock signal phi1. The output amplifier and driver circuitry 541 is pre-charged and enabled by the transistors 547, 549, 557, 559 and the clock signals phi2 and phi3. Each of the nodes 531, 551 and 561 are pre-charged to a relatively high level, i.e., the electrical potential 513. If the data stored in the static memory cell 503 is such that the Flash memory device turns on when the address word line 507 is activated, the output of the sense amplifier 521, at node 531, will stay high when enabled by the clock signal phi1. Only the output at node 551 must make a transition from high to low when it is enabled by its clock signal phi2. The data remains valid at the output node 561 and becomes unconditionally valid after the start of the clock signal phi3 or, alternatively, the data appears at the output node 561 about one gate delay after the memory cell 503 is accessed.

If the data in the static memory cell 503 is such that the memory cell transistor does not turn on when the address word line 507 is activated, the output of the sense amplifier 521, at node 531, will transition from high to low after the clock signal phi1 activates the sense amplifier. The signal at the output node 561 will also transition from high to low after the clock signal phi3 enables that stage. By separating the clock signals phi1, phi2 and phi3 by one-third of a normal inverter delay, the valid data will appear at the output node 561 after one normal gate delay. In contrast, in a conventional static CMOS or pseudo-NMOS circuit, the data would not be valid at the output until after three gate delays.

FIG. 8 illustrates a combination of a dynamic memory cell and a sense amplifier and output circuitry that embodies aspects of the present invention. In the illustration of FIG. 8, the dynamic memory cell 603 may be a DRAM cell with one transistor, a DRAM cell with more than one transistor, a dynamic shift register cell, a CCD output or any other memory which depends upon the storage or charge on capacitive nodes. The cross-coupled sense amplifier 611 and the amplifiers 631, 641 and 651 have been more fully described above. In the operation of the device illustrated in FIG. 8, the cross-coupled sense amplifier 611 is pre-charged to approximately one-half of the electrical potential 613. However, the outputs 639, 649 and 659 of the amplifiers 631, 641 and 651, respectively, are pre-charged to approximately the value of the electrical potential 613. In operation, if the sense amplifier 611 output on the data bit line 621 goes high when the memory cell 603 is accessed, the output 639 of the amplifier 631 will transition from high to low. In addition, the output of the sense amplifier 611 on the complementary data bit line 623 goes low, and the output 649 of the amplifier 641 will remain at its high pre-charged value. The output 659 of the amplifier 651 will remain in its high pre-charged state so that data at the output 659 will remain high. The data at the output 659 will be valid and becomes unconditionally valid at the beginning of the clock signal phi3. Only the amplifier 631 will change state and transition its output 639 from high to low; however, this transition is a fast transition and is of no consequence to the output 659.

If data on the bit line 621 goes low when the dynamic memory cell 603 is accessed, the amplifier 631 will not change state, but the amplifier 641 will change state. On the beginning of the clock cycle phi3, the output 659 of the amplifier 651 will transition from high to low and data at the output 659 will also transition from high to low. Again, because the delay between the clocks is about one-third of a normal signal propagation delay, the data at the output 659 becomes valid after one normal propagation delay, as opposed to three delays as in a normal sense amplifier scheme.

As described above, the sensing circuitry of the present invention may be employed with advantage in a variety of memory types. For example, the inventive sense amplifier and output circuitry may be utilized in DRAMs, SRAMs. Flash memories, EAPROMs, EEPROMs, EPROMs, PROMs, ROMs, dynamic shift register cells, CCD outputs, or any other memory type in which data storage is represented in the form of a stored charge or a stored potential. Moreover, in those cases, for example, where the memory cell provides both TRUE and COMPLEMENTARY outputs, a single memory cell may be combined with the inventive sensing circuitry to provide improved read access times. By way of further example, in cases where a memory cell provides only a single output, the cell may be combined with the inventive sensing circuitry, either alone or together with a reference charge or reference potential, to achieve improved read access times. Accordingly, sensing circuits that embody the present invention, as set forth in the appended claims, may provide greatly improved access times as compared to known sensing circuits.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   pre-charging a first output node of a sense amplifier to approximately a first power supply voltage;
   pre-charging a second output node of the sense amplifier to approximately a second power supply voltage, wherein the first power supply voltage is different from the second power supply voltage;
   providing a first input signal; and
   providing first and second output signals at the first and second output nodes of the sense amplifier, respectively, in response to at least the first input signal.

2. The method of claim 1, further comprising pre-charging an output node of a driver circuit to approximately the first power supply voltage, wherein the driver circuit is coupled to one of the first and second output nodes of the sense amplifier.

3. The method of claim 1, further comprising:
   pre-charging a first output node of a driver circuit to approximately the first power supply voltage; and
   pre-charging a second output node of the driver circuit to approximately the second power supply voltage, wherein the first and second output nodes of the sense amplifier are coupled to first and second input nodes of the driver circuit, respectively.

4. The method of claim 1, further comprising providing a second input signal.

5. The method of claim 4, further comprising providing the first and second output signals at the first and second output nodes of the sense amplifier, respectively, in response to the first and the second input signals.

6. The method of claim 4, wherein providing the second input signal comprises providing the second input signal complementary to the first input signal.

7. The method of claim 4, wherein providing the first and the second input signals comprises providing the first and second input signals to first and second input nodes of the sense amplifier adapted to be coupled to first and second output nodes, respectively, of an integrated circuit memory cell.

8. The method of claim 7, wherein pre-charging the first output node of the sense amplifier comprises pre-charging the first output node of the sense amplifier to approximately a predicted output voltage of the first output node of the integrated circuit memory cell.

9. The method of claim 8, wherein pre-charging the first output node of the sense amplifier to approximately the predicted output voltage of the first output node of the integrated circuit memory cell comprises pre-charging the first output node of the sense amplifier to approximately the predicted output voltage of the first output node of the integrated circuit memory cell corresponding to a non-conducting state of the integrated circuit memory cell.

10. The method of claim 8, wherein pre-charging the second output node of the sense amplifier comprises pre-charging the second output node of the sense amplifier to approximately a predicted output voltage of the second output node of the integrated circuit memory cell.

11. The method of claim 7, wherein pre-charging the second output node of the sense amplifier comprises pre-charging the second output node of the sense amplifier to approximately a predicted output voltage of the second output node of the integrated circuit memory cell.

12. The method of claim 11, wherein pre-charging the second output node of the sense amplifier to approximately the predicted output voltage of the second output node of the integrated circuit memory cell comprises pre-charging the second output node of the sense amplifier to approximately the predicted output voltage of the second output node of the integrated circuit memory cell corresponding to a non-conducting state of the integrated circuit memory cell.

13. The method of claim 1, wherein pre-charging the first output node of the sense amplifier comprises pre-charging the first output node of the sense amplifier to a logic value corresponding to a predicted logic value stored in an integrated circuit memory cell to which the first output node is coupled.

14. The method of claim 13, wherein pre-charging the second output node of the sense amplifier comprises pre-charging the second output node of the sense amplifier to a logic value corresponding to a logical complement of the predicted logic value stored in the integrated circuit memory cell.

15. The method of claim 1, wherein pre-charging the second output node of the sense amplifier comprises pre-charging the second output node of the sense amplifier to a logic value corresponding to a logical complement of a predicted logic value stored in an integrated circuit memory cell to which the second output node is coupled.

16. A method of reading an integrated circuit memory cell, comprising:

pre-charging a first output node of a sense amplifier to approximately a first power supply voltage;

pre-charging a second output node of the sense amplifier to approximately a second power supply voltage, wherein the first power supply voltage is different from the second power supply voltage;

coupling a first and a second output node of the integrated circuit memory cell to a first and a second input node of the sense amplifier, respectively; and providing first and second output signals at the first and second output nodes of the sense amplifier, respectively, in response to first and second output signals from the integrated circuit memory cell to the first and second input nodes of the sense amplifier.

17. The method of claim 16, wherein pre-charging the first and second output nodes of the sense amplifier comprises pre-charging the first and second output nodes of the sense amplifier to approximately first and second predicted output voltages of the first and second output nodes of the integrated circuit memory cell.

18. The method of claim 17, wherein pre-charging the first and second output nodes of the sense amplifier to approximately the first and second predicted output voltages of the first and second output nodes of the integrated circuit memory cell comprises pre-charging the first and second output nodes of the sense amplifier to approximately the first and second predicted output voltages of the first and second output nodes of the integrated circuit memory cell corresponding to a non-conducting state of the integrated circuit memory cell.

19. The method of claim 16, further comprising pre-charging an output node of a driver circuit to approximately the first power supply voltage, wherein the driver circuit is coupled to on& of the first and second output nodes of the sense amplifier.

20. The method of claim 16, further comprising:

pre-charging a first output node of a driver circuit to approximately the first power supply voltage; and pre-charging a second output node of the driver circuit to approximately the second power supply voltage, wherein the first and second output nodes of the sense amplifier are coupled to first and second input nodes of the driver circuit, respectively.

* * * * *